United States Patent
Hargrove et al.

(10) Patent No.: US 6,531,741 B1
(45) Date of Patent: Mar. 11, 2003

(54) DUAL BURIED OXIDE FILM SOI STRUCTURE AND METHOD OF MANUFACTURING THE SAME

(75) Inventors: Michael J. Hargrove, Clinton Corners, NY (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/261,333

(22) Filed: Mar. 3, 1999

(51) Int. Cl.[7] ............................................. H01L 21/265

(52) U.S. Cl. ........................................ 257/350; 257/349

(58) Field of Search ................................. 257/347, 349, 257/350; 438/479

(56) References Cited

U.S. PATENT DOCUMENTS

| | | | | |
|---|---|---|---|---|
| 4,704,302 A | * | 11/1987 | Bruel et al. | 427/38 |
| 5,608,252 A | * | 3/1997 | Nakato | 257/347 |
| 6,143,591 A | * | 11/2000 | Manning | 438/151 |

* cited by examiner

*Primary Examiner*—Minh Loan Tran
*Assistant Examiner*—Thomas L. Dickey
(74) *Attorney, Agent, or Firm*—Connolly Bove Lodge & Hutz LLP; M. F. Chadurjian

(57) ABSTRACT

An SOI structure with a dual thickness buried insulating layer and method of forming the same is provided. A first substrate has raised portions each with a planar top surface. A dielectric layer covers the first substrate and its raised portions. The dielectric layer has a planar top surface. A second substrate layer is formed on the planar top surface of the dielectric layer. Semiconductor elements may be formed in the second substrate layer. The semiconductor elements pertain to core circuit elements, peripheral circuits, and electrostatic discharge (EDS) circuits.

25 Claims, 8 Drawing Sheets

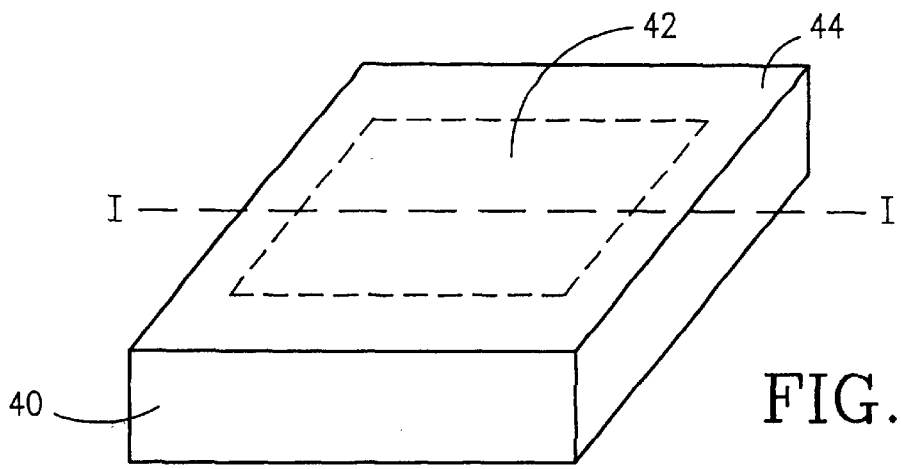
FIG. 4A
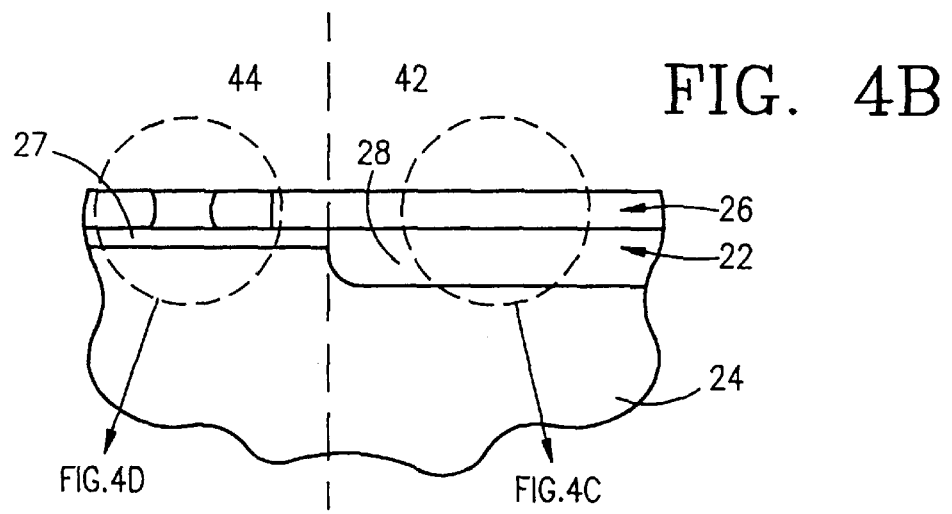
FIG. 4B
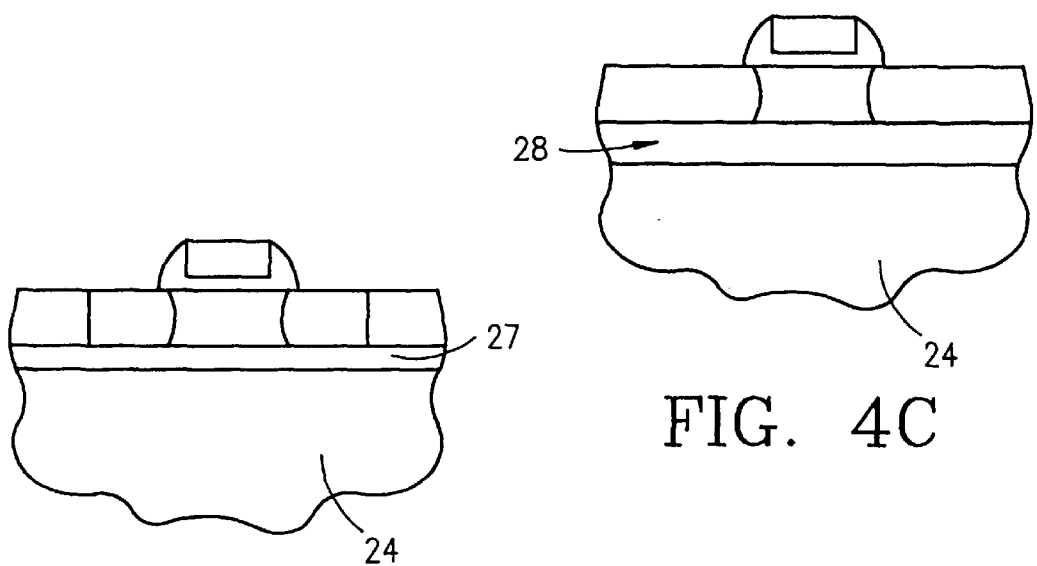
FIG. 4C
FIG. 4D

DUAL BURIED OXIDE FILM SOI STRUCTURE AND METHOD OF MANUFACTURING THE SAME

TECHNICAL FIELD

The present invention relates generally to silicon on insulator (SOI) integrated circuits, and more particularly to an SOI structure in which the thickness of the buried insulating film varies to change the thermal and capacitive coupling to the substrate wafer.

BACKGROUND OF THE INVENTION

Integrated circuits continue to be developed at a very rapid pace and higher density, higher speed and larger capacity devices continue to be achieved. Particularly, it has been recognized that by forming semiconductor devices using an SOI structure, increased performance and packaging density can be obtained. An SOI structure has semiconductor devices formed on a substrate in which a buried insulator region is typically formed by ion implantation. A known SOI structure is shown in FIG. 1. A buried oxide film 3 is arranged between first 1 and second 2 substrates. As shown in the figure, the buried oxide film 3 is of uniform thickness and both the top 4 and bottom 5 surfaces of the buried oxide 3 are substantially planar. It is known to form various circuit elements in the second substrate, for example, a MOSFET as shown in FIG. 1. Source and drain regions 7,8 are formed in the second substrate 2. A gate structure 9 is then formed over the second substrate 2 between the source and drain regions 7,8. The buried oxide film 3 insulates the first substrate 1 commonly referred to as the bulk substrate, from the second substrate 2, the body of the transistor.

SOI provides significant advantages over bulk technology and will achieve the scaling objectives of low power and high performance for future technologies. SOI provides reduced short channel effects, reduced electric field strength, reduction of parasitic capacitance, higher speed and lower power consumption, among other technology benefits.

However, the buried insulator introduces a thermal impedance in series with the bulk substrate. This thermal impedance can be detrimental to temperature control or self heating of SOI device structures, for example the resistors, capacitors, MOSFETs, diodes or other device structures which may be contained in an SOI process. Reducing the thermal resistance in series with the SOI structure can provide advantages regarding device operation, failure mechanism and reliability, for example, hot E, electromigration, and electrostatic discharge (ESD) protection among others. Additionally, the capacitive coupling with the bulk substrate is affected by the thickness of the buried insulator. These thermal and capacitive effects can either be detrimental or advantageous, depending on the circuit device.

Thus, there is a need for an SOI structure which can reduce the thermal impedance, the thermal capacitance, and the capacitive coupling effects where desired in the semiconductor device, while at the same time utilizing these effects in areas where they are beneficial.

SUMMARY OF THE INVENTION

A method and apparatus thereof for forming a dual thickness buried oxide SOI structure is provided. The present invention varies the thickness of the buried oxide to alter the thermal resistance, the thermal capacitance and the electrical capacitance in certain areas of semiconductor devices used in an SOI process. The present invention allows the thickness of the buried oxide to be varied over an entire silicon wafer, in an individual circuit element, or in both. The present invention can thus provide reduced or increased thermal resistance, thermal capacitance and electrical capacitance wherever desired in a particular implementation.

According to one embodiment of the invention, a first substrate layer having raised portions each with a planar top surface is provided. A dielectric layer is formed over the first substrate layer and its raised portions. The dielectric layer has a planar top surface. A second substrate layer is arranged on the planar top surface of the dielectric layer.

In another embodiment, a first substrate layer having raised portions is provided. A first non-continuous dielectric layer is provided on top of the first substrate layer. The top surface of the first dielectric layer is substantially co-planar with the top surfaces of the raised portions of the first substrate. A second continuous dielectric layer is formed over the first dielectric layer and the raised portions of the first substrate. The second dielectric layer has a planar top surface. A second substrate is formed on top of the planar top surface of the second dielectric layer.

Various methods can be used to realize the dual thickness buried oxide structure of the present invention. According to one method, a first blanket layer of oxygen ions is implanted to a predetermined depth in a substrate. A mask is then formed on the substrate and a second oxygen ion implantation takes place. The second masked oxygen ion implant is done deeper than, but forms a region continuous with the first oxygen ion implant. The mask is then removed and the ion implanted substrate is heat treated to form a buried oxide layer.

In another method, an oxide growth retarding implant region is formed in a selected area of a substrate. A blanket oxygen ion implant is then performed over the entire substrate. The oxygen ion implant is done at an energy level and a dose such that it reaches at least to the oxide growth retarding region. The oxide growth retarding implant prevents the oxide layer from forming in selected areas of the substrate resulting in a dual thickness buried oxide. The substrate is then heat treated to form the dual thickness buried oxide layer.

According to another method, shallow trench isolation is performed in the substrate. The substrate is then polished and a oxide layer with a co-planar top surface is formed on top thereof in a known manner. A second substrate wafer is then attached on the co-planar top surface of the oxide layer and heat treatment is performed for bonding. The second substrate layer is then etched to a desired thickness.

BRIEF DESCRIPTION OF THE DRAWINGS

The present invention will now be further described in the following pages of the specification, when taken in conjunction with the attached drawings, in which:

FIGS. 4a–c illustrate a silicon chip and its circuits formed on thick and thin portions of buried oxide;

DETAILED DESCRIPTION OF THE INVENTION

The present invention provides a dual thickness buried insulator structure and method for forming the same in SOI structures. A dual thickness buried insulator layer has its thickness vary in selected areas of a substrate. The buried insulator extends continuously through the substrate and has a top surface which is co-planar and a bottom surface which has a irregular shape, resulting in the varying thicknesses. Preferably, the substrate has raised portions which fill the irregular parts of the bottom surface of the buried insulator.

By varying the thickness of the buried oxide, the thermal resistance, thermal capacitance and capacitive coupling of the SOI structure can be varied. Increased or decreased thermal resistance, thermal coupling and electrical coupling can be provided where desired.

The thermal resistance of the insulator can be estimated as $R_{TH} = t_{film}/K_{SiO2} \, W \times L$ where $t_{film}$ is the film thickness, $W_{is}$ is width, L is length (Area $= W \times L$) and $K_{SiO2}$ is the thermal conductivity. The thermal capacitance is $C_{TH} = \rho C_\rho \, t_{film} \cdot W \cdot L$ where $\rho$ is mass density and $C_\rho$ is the heat capacity. As the film thickness of the buried insulator decrease $R_{TH}$ and $C_{TH}$ decrease.

In a pulsed mode, the power-to-failure $P_f$ is a function of:

$$\frac{P_f}{A} = \sqrt{\pi K \rho c_p} \frac{(T-t)}{\tau^{1/\tau}}$$

where $\tau$ is the failure temperature and $\tau$ is pulse width, A is area (A=W·L). As K, $\rho$, $C_\rho$ decrease, the power at the failure decreases, causing early failure of the electrical component.

As the buried oxide film thickness is reduced, the electrical element thermal robustness of the element improves. This is important for high current, or high voltage phenomenon. For electrical overstress (EOS) and electrostatic discharge (ESD) events, both the thermal impedance reduction for both peripheral circuits and ESD devices is advantageous. Hence, MOSFET, resistor, diode, bipolar transistor and other elements will have a higher $P_f$ for a given pulse width.

Figure 1:
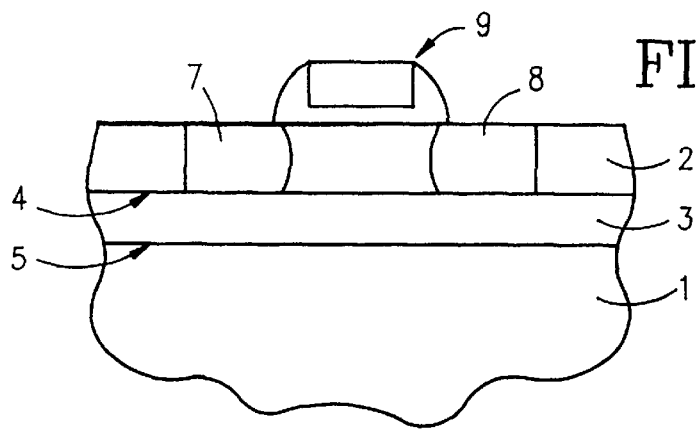
FIG. 1 illustrates a prior art SOI MOSFET.
Figure 2A:
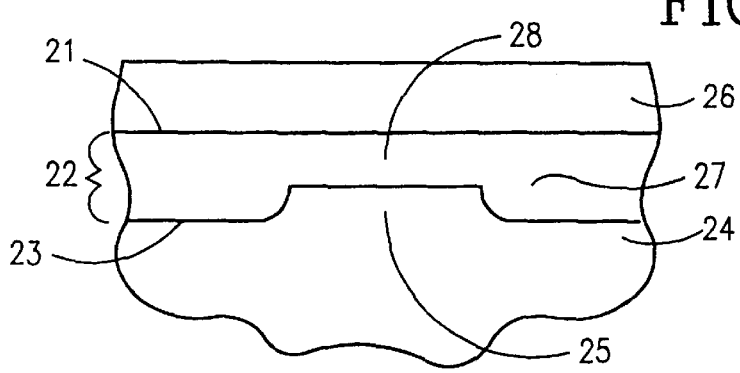
FIGS. 2a and 2b illustrate an SOI substrate with a dual thickness oxide film.

FIG. 2a shows one basic embodiment of the invention. A dual thickness buried oxide film 22 is formed between a first substrate 24 and a second substrate 26. The first substrate 24 has a raised portion 25. A bottom surface 23 of the buried oxide 22 is preferably formed directly on the first substrate 24 and continuously covers the first substrate 24 and the raised portion 25. Due to the raised portion 25, the bottom surface 23 is not planar. The buried oxide film 22 isolates the first substrate 24 from the second substrate 26. Preferably, a top surface 21 of the buried oxide film 22 is substantially planar and substantially perpendicular to a top surface of the second substrate 26. By forming the buried oxide film 22 over the first substrate 24 and the raised portion 25, thick portions 27 and thin portions 28 of the buried oxide film 22 are formed. The second substrate film 26 is preferably formed directly on top of the top planar surface 21 of the buried oxide film 22. Individual circuit elements may be formed in the second substrate 26. Preferably, the buried oxide film 22 extends between the first 24 and second 26 substrates as a continuous film and isolates the first substrate 24, that is the bulk substrate 26, from the second substrate, the "body".

Figure 2B:
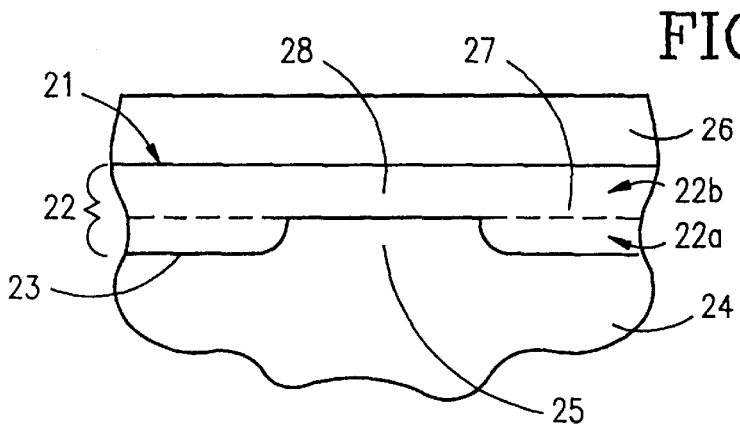

Alternatively, the buried oxide film 22 can be two separate oxide films as shown in FIG. 2b. A first non-continuous buried oxide film 22a is formed on the first substrate 24. Oxide film 22a is not formed on the raised portions 25 of the first substrate 24. Preferably, the top surfaces of both raised portion 25 and oxide film 22a are substantially co-planar as shown in FIG. 2a. A second oxide film 22b is formed on the top surface of the raised portion 25 and the top surfaces of oxide film 22a. Oxide film 22b is continuous and has a substantially planar top surface. Together, oxide films 22a and 22b form the buried oxide film 22 which separates the first 24 and second 26 substrates from each other.

By varying the thickness of the buried oxide 22, it is possible to modulate the thermal resistance and the capacitive coupling for SOI structures as discussed above.

The present invention can be employed at various levels of semiconductor manufacture. The thickness of the buried oxide can be varied over an entire wafer, between different circuits on a chip, in individual circuit elements or any combination of the above.

Figure 3:
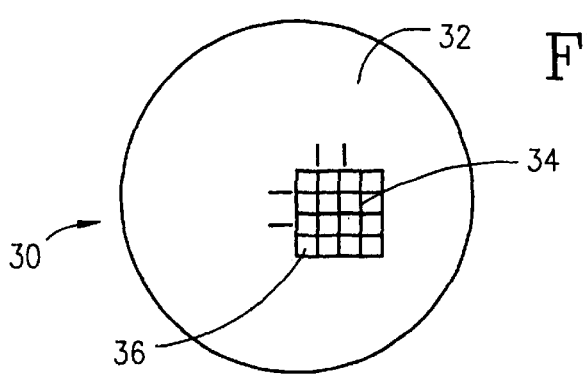
FIG. 3 illustrate a full wafer substrate having thick and thin portions of buried oxide.

FIG. 3 shows a full wafer substrate 30 employing the dual thickness buried oxide of the present invention. In this embodiment, a thick buried oxide is formed in a region 32 around the exterior of the wafer 30 and thin buried oxide is formed in an interior region 34 of the wafer 30. Individual chips 36 are formed on the wafer 30 in either the region 32 of the thick buried oxide or the region 34 of the thin buried oxide, depending on the chip's application.

The concept of the present invention can also be used in individual chips or circuits. In this application, the thickness of the buried oxide will vary conditional on the spacial dependence or the chip architecture. For example, at the circuit level, a thin buried oxide in an SOI structure has the disadvantages of causing backside electrical coupling, capacitive coupling and forming a backside bipolar transistor while a thick oxide layer has the thermal disadvantages discussed above. Therefore, circuits are formed over thick or thin regions of buried oxide depending on which factors are relevant for that particular circuit.

Referring now to FIGS. 4a–c, a chip 40 is shown having core 42 and peripheral 44 circuits. The thickness of the buried oxide is varied within the chip. For example, the core circuits may be formed over a thick region of the buried oxide and the peripheral circuits may be formed over a thin region of the buried oxide. FIG. 4b shows a cross section taken along line 1 of FIG. 4a. As shown in FIG. 4b, both the core circuits and the peripheral circuits are formed in a common substrate. First 24 and second 26 substrates are separated by a buried oxide 22. The buried oxide 22 has a thick region 28 formed in the center of the chip and under the core circuits, while a thin region 27 of buried oxide 22 is formed under the peripheral circuits. Individual circuit elements can then be formed in the core and peripheral circuit portion of the second substrate as shown in FIG. 4c.

Whether the circuits are formed over the thick or thin regions of the buried oxide is determined based on individual circuit functions. Circuits in which capacitive coupling effects are not a concern, but where heat dissipation is, are formed over the thin buried oxide. Circuits for I/O and ESD protection, for example, would be formed as peripheral circuits over the thin region of the buried oxide, as opposed to the core circuits where a thick buried oxide is desirable.

Additionally, the chip 40 may be formed in either the region of thick buried oxide 32 or the region of thin buried oxide 34 of the wafer 30 shown in FIG. 3. Thus, even if the chip 40 is formed in thick region 32, it is possible to vary the thickness of the buried oxide within the individual chip 40 as shown in FIGS. 4a–c. Thus, individual chips formed next to each other on the substrate do not necessarily have the same arrangement of thick and thin buried oxide.

Along the same lines, the thickness of the buried oxide can also be varied within individual circuit elements, such as transistors within a chip. The individual circuit elements may be part of either the core circuits or the peripheral circuits shown in FIG. 3. For example, a circuit may be formed in the core of the chip over the thick part of the buried oxide, but an individual transistor on the chip may have thick and thin portions of buried oxide arranged under certain parts of its structure.

Figure 5A:
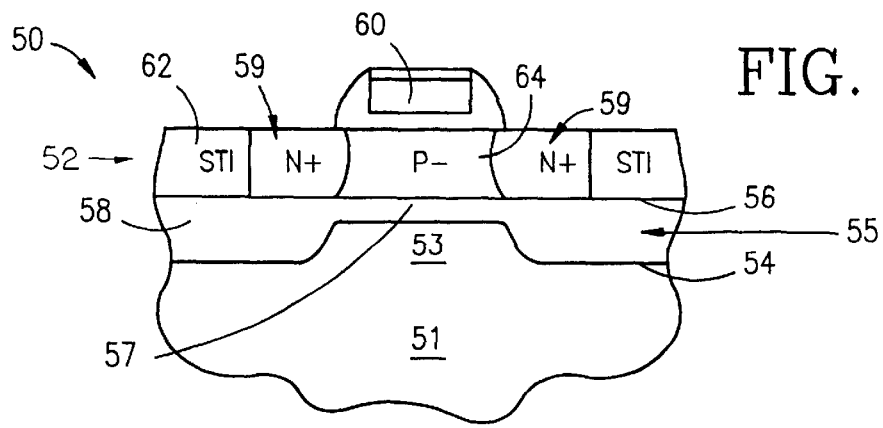
FIGS. 5a and 5b illustrate various embodiments of a MOSFET formed on a dual thickness buried oxide.

FIG. 5a shows a individual transistor 50, a MOSFET, with the dual thickness buried oxide structure. A first substrate 51 having a raised portion 53 is provided. The first substrate 51 is commonly referred to as the bulk substrate. The buried oxide 55 is arranged on top of the first substrate 51. The buried oxide 55 has a planar top surface 56, while the bottom surface 54 is irregular. Preferably, the raised portion 53 of the first substrate 51 extends into the uneven parts of bottom surface 54. In this way, thick 58 and thin 57 regions of the buried oxide 55 are created. A second substrate 52 is formed on top of the planar top surface 56 of the buried oxide film 55. Circuit elements are formed in the second substrate 52. Source/drain regions 59 are each formed in the second substrate 52. A first gate structure 60 is formed over the second substrate 52 between the source/drain 59. The buried oxide 55 is preferably continuous and extends over the entire first substrate 51, isolating the first substrate 51 from the second substrate 52. The resulting structure is a MOSFET with a channel region 64 between the source/drain 59 under the first gate structure 60. Shallow trench isolation 62 may be used to isolate the MOSFET from other circuit elements.

Figure 5B:
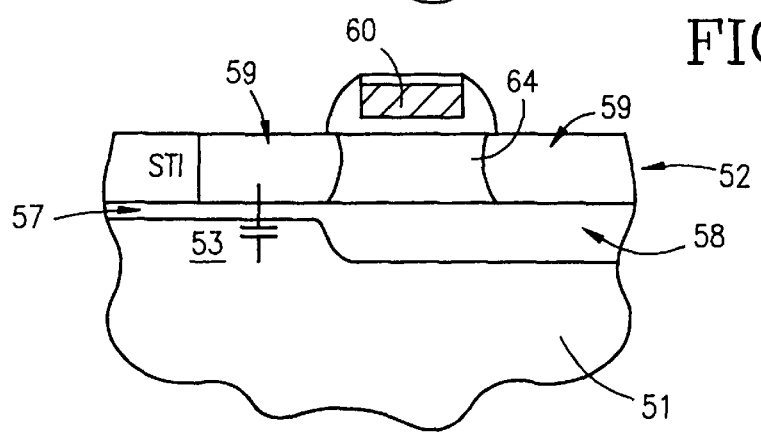

In this embodiment, the thin region 57 of the buried oxide 55 is formed substantially underneath the first gate structure 60 and the channel region 64. Alternatively, as shown in FIG. 5b, the raised portion 53 and the thin portion 57 of the buried oxide 55 can be formed under one of the source/drain 59 and the thick portion 58 formed under the channel region 64 and the other of the source/drain 59. The particular arrangement of the thick 58 and thin 57 portions can vary depending on the use of the individual transistor. For example, by providing the thick portion 58 of the buried oxide 55 under the channel region 64, the capacitive coupling of the channel 64 to the first substrate 52 is reduced. Although the channel region 64 will heat up, the thin portion 57 of the buried oxide 55 arranged under the source/drain 59 is used to remove the heat. Of course, if the disadvantages of the thin buried oxide, such as capacitive coupling and electrical coupling, are not a concern, it may be advantageous to use the opposite arrangement as shown in FIG. 5a. There are many different arrangements possible for the thick and thin regions of the buried oxide under the transistor. Which of these alternatives is preferred will depend on the specific application.

Figure 6:
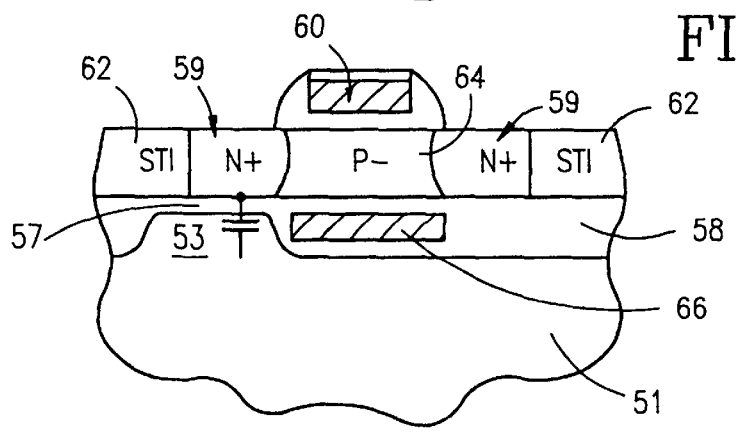
FIGS. 6–8 illustrate embodiments of the invention including a second gate structure formed in the thick portion of the buried oxide.

FIG. 6 illustrates another embodiment of the present invention. Here, the thin portion 57 of the buried oxide film 55 is formed under one of the source/drain 59 and the thick portion 58 is formed under the remaining structure of the transistor. This embodiment is substantially similar to that shown in FIG. 5b, except that a second gate structure 66 is formed in the thick portion 58 of the buried oxide film 55. The second gate structure 66 is formed under the channel region 64 and the first gate structure 60. The first gate structure 60 is commonly referred to as a top gate while the second gate structure 66 is referred to as a back or a bottom gate.

Using a back or bottom gate provides several benefits. The bottom gate can be used to turn on the back side circuit to improve the current drive of the transistor, as well as to shield the first and second substrates electrically. Of particular concern here, it also dissipates the heat from the channel region 64. As the second gate 66 is not formed under the source/drain regions 59 in this embodiment, the thin region 57 of the buried oxide 55 is preferably formed under one of the source/drain 59 to help dissipate heat.

In a dual thickness buried oxide structure, the region of the transistor formed over the thin buried oxide has higher electrical capacitance, lower thermal resistance and lower thermal capacitance than the thick oxide. As with the above embodiments, the positioning of the thick and thin portions of the buried oxide can vary depending on the particular use of the circuit element. For example, the increased electrical capacitance and the higher stored charge on the capacitor resulting from the position of thin buried oxide in this embodiment is useful for DRAMs, SRAM for switching, SER and other applications.

Figure 7:
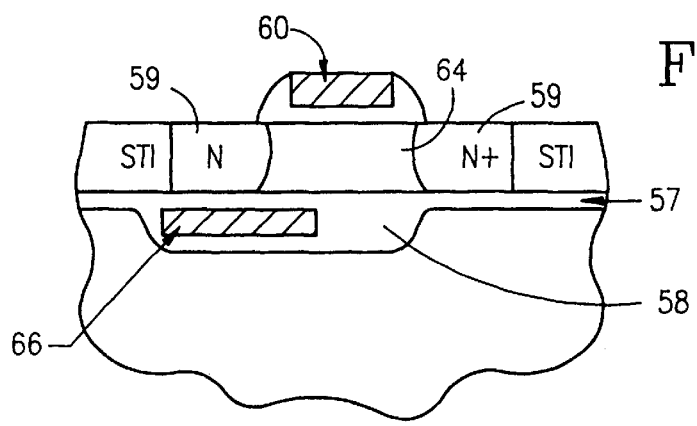

FIG. 7 shows another embodiment of the invention which is substantially the same as that shown in FIG. 6. However, it differs in that the second gate structure 66 is not formed under the channel region 64 and the first gate structure 60, but under one of the source/drain regions 59. The other of the source/drain regions 59 is formed over the thin portion 57 of the buried oxide 55. The second gate structure 66 is used as a capacitor and this particular embodiment could be useful, for example, as a DRAM. Again, the position of the thick and thin portions of the buried oxide, as well as the second gate, can vary.

In order to fit the second gate 66 in the buried oxide 55 underneath the second substrate 52, it is necessary that the buried oxide 55 be relatively thick. This increase in thickness of the buried oxide results in an increase in the thermal impedance in series with the bulk substrate, as discussed above. However, with the present invention, it is not necessary to have the thermal disadvantages created by the thicker buried oxide exist throughout the semiconductor device. The thin buried oxide and its attendant advantages can be provided in areas in the buried oxide where the second gate is not formed.

Figure 8:
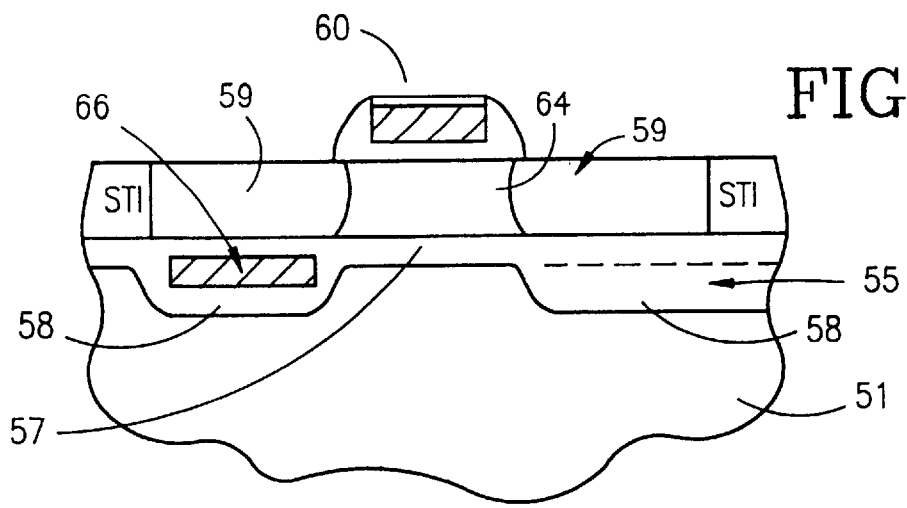

Referring now to FIG. 8, an embodiment of the present invention which is similar to that shown in FIG. 7 is shown, except that the thin portion 57 of the buried oxide is arranged under the channel region 64 and the first gate structure 60. Thick portions 58 of the buried oxide 55 are arranged under both of the source/drain regions 59, with the second gate 66 formed in the thick portion 58 of the buried oxide 55 under one of the source/drain regions 59. The buried second gate 66 here is used as a capacitor plate. Depending on what the transistor of this embodiment is connected to, the need for the thermal advantages provided by the thin oxide may be desirable at certain areas, while they may be detrimental at others. Again, there are many possible arrangements of the thick and thin portions of the buried oxide.

Figure 9:
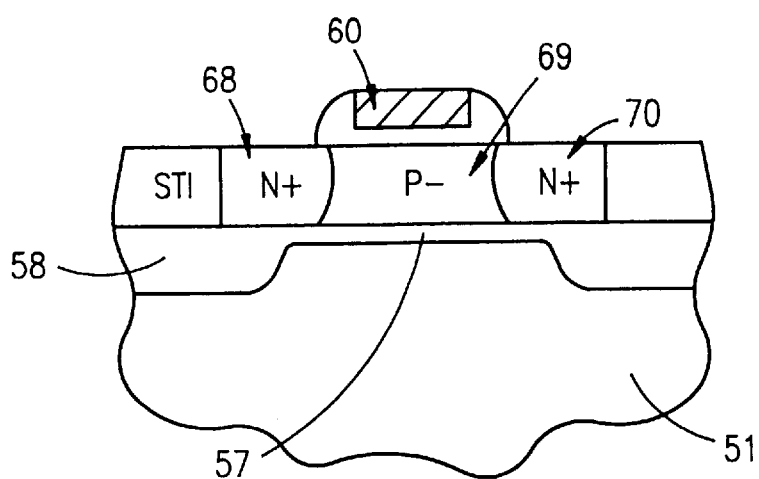
FIG. 9 illustrates a bipolar element formed over a dual thickness buried oxide.

A bipolar element utilizing the dual thickness buried oxide structure of the present invention is shown in FIG. 9. The bipolar element is formed similar to a MOSFET, except that the first gate structure 60 is not used, it either floats or is grounded. As with the other embodiments described above, the thin portion 57 of the buried oxide 55 can be arranged in those areas of the bipolar element where the thermal advantages provided by the thin oxide are desired, and where capacitive coupling and electrical coupling are not a concern. FIG. 9 shows the thin portion 57 formed under substantially all of the collector 68 base 69 and emitter 70 of the bipolar element. However, many variations will be apparent to one skilled in the art.

Figure 10:
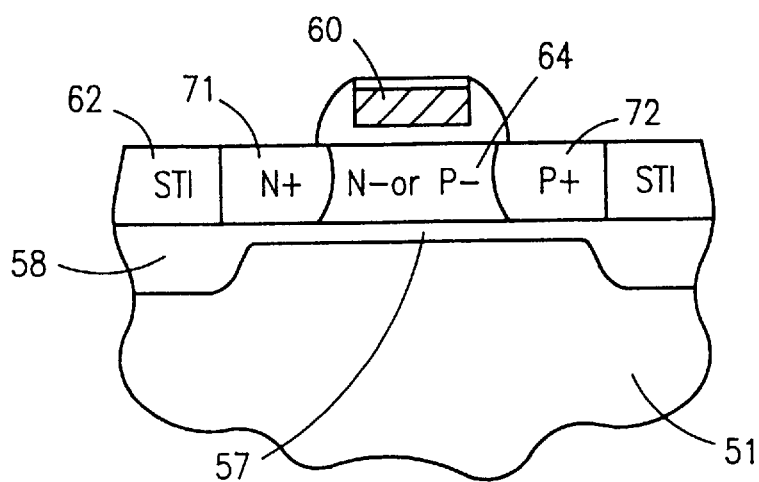
FIG. 10 illustrates a polysilicon lateral diode formed on a dual buried oxide structure.

A polysilicon lateral diode on the dual buried oxide structure of the present invention is shown in FIG. 10. The structure is similar to the MOSFET's described above. However, in this embodiment the source/drain regions 59 are replaced with a cathode 71 of a first conductivity type and an anode 72 of a second conductivity type formed in the second substrate 52. The channel region 64 under the first gate structure 60 may be either of the first or second conductivity types and is preferably lower doped than the anode 72 or cathode 71. The thin region 57 of the buried oxide 55 is formed under the polysilicon lateral diode and dissipates the heat generated therein. The locations of the thick 58 and thin 57 portions of the buried oxide structure can vary in this embodiment also.

Figure 11A:
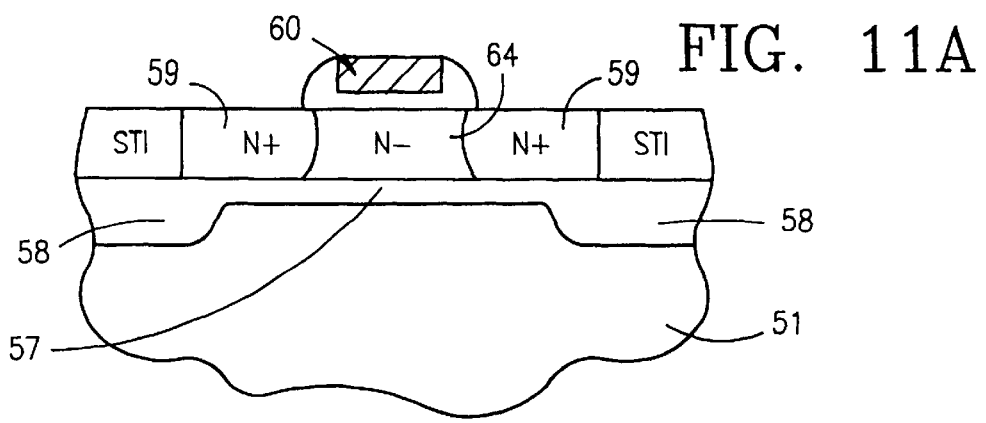
FIGS. 11a and 11b illustrate decoupling capacitor structures formed on a dual thickness buried oxide structure.
Figure 11B:
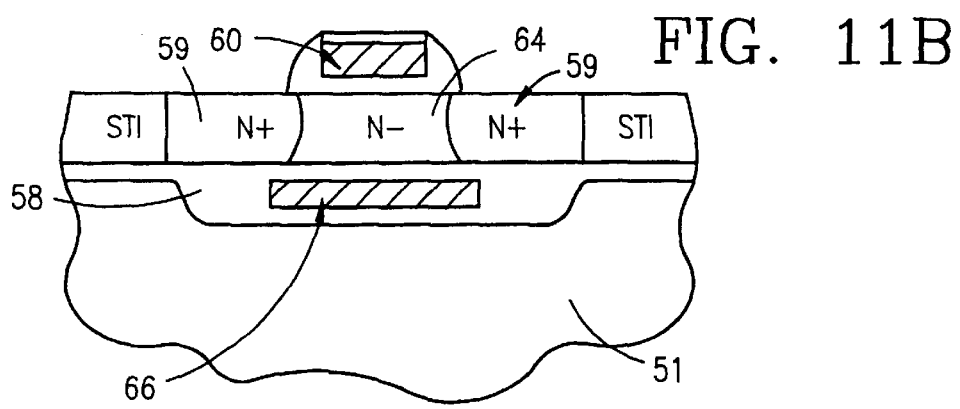

FIGS. 11a and 11b show a decoupling capacitor structure employing the concept of the present invention. Here, the channel region 64 is of the same conductivity type of the source/drain region 59, but is lower doped. The source/drain regions 59 serve as contacts for the capacitor. In FIG. 11a, the thin region 57 of the buried oxide 55 structure extends under substantially all of the decoupling capacitor structure. The embodiment shown in FIG. 11b, differs from that shown in 11a in that the thick portion 58 of the dual buried oxide structure 55 is formed under substantially all of the decoupling capacitor structure and the second gate 66 is formed in the thick portion 58 of the buried oxide 55.

Figure 12A:
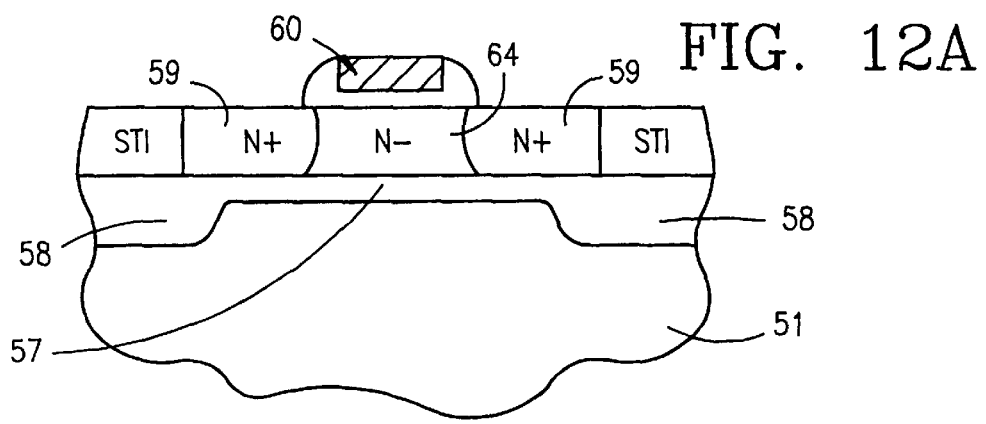
FIGS. 12a and 12b illustrate resistor elements formed on a dual thickness buried oxide structure.
Figure 12B:
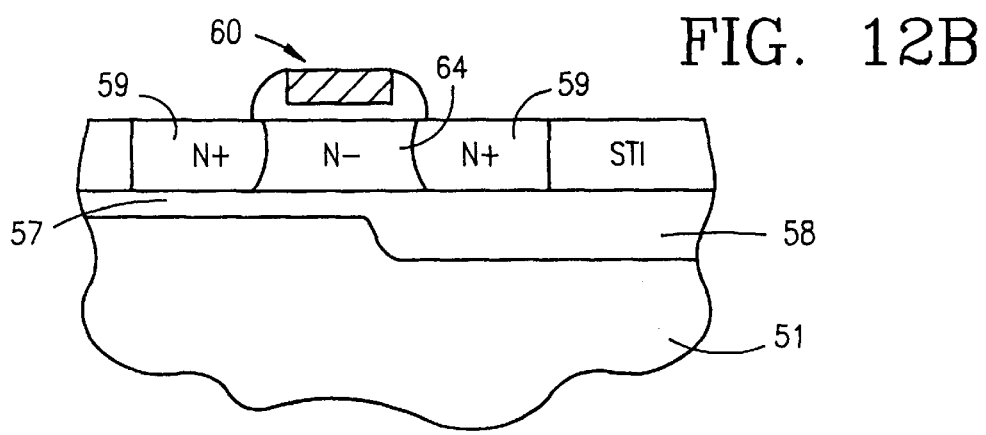

FIGS. 12a and 12b show resistor elements using the dual thickness buried oxide structure. Heating of resistors is of a particular concern as self-heating of the resistors changes their resistance. Thus, the thermal advantages provided by a thin buried oxide are particularly useful here. FIG. 12a shows an embodiment where the thin portion 57 of the buried oxide 55 is formed under substantially all of the resistor. FIG. 12b shows a resistor element with a voltage tolerant input in which the thin portion 57 is formed under part of the first gate structure 60 and the output, while the thick portion 58 of the dual thickness buried oxide is formed under the input of the resistor.

From the above, it is clear that the dual thickness buried oxide can be used in a variety of ways. The thickness can vary across an entire wafer or within an individual circuit element. Additionally, the dual thickness buried oxide structures described above can be formed in several different ways. Each of the above described embodiments can be formed using any of the following methods.

Figure 13A:
FIGS. 13a–13d illustrate a first method for forming a dual thickness buried oxide structure.
Figure 13B:
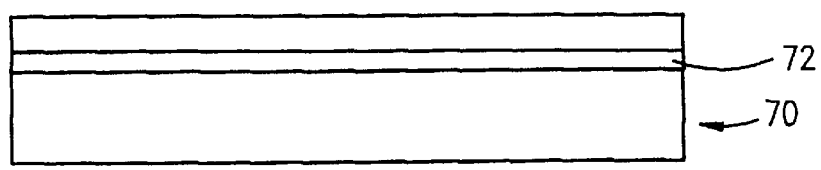
Figure 13C:
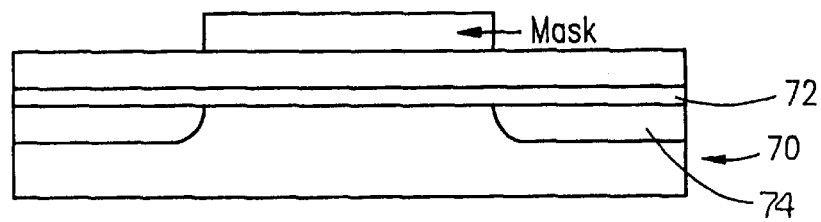
Figure 13D:
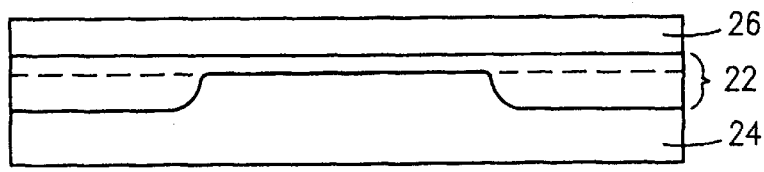

Referring now to FIGS. 13A–D, a first method of forming the dual thickness buried oxide will be described. A standard starting wafer or substrate 70 is provided. Oxygen ions are implanted into the substrate, preferably at a dose range of $10^{17}$ to $10^{19}/cm^2$ and an energy level of 100 to 200 keV, so that a first continuous layer of oxygen ions 72 is formed under the surface of the substrate as shown in FIG. 13B. A photoresist mask pattern is formed on the surface of the substrate in areas where a thin buried oxide is desired. A second implantation of oxygen ions is then performed, preferably at a dose of $10^{17}$ to $10^{19}/cm^2$ and an energy level of 100 to 200 keV. As shown in FIG. 13C, the masked second implant preferably extends at least from the bottom of the first implant, creating a planar top surface and an irregular bottom surface. The mask is then removed and heat treatment is performed to form the dual thickness buried oxide film shown in FIG. 13D. This structure is similar to that shown in FIG. 2A and the same reference numbers are used. If necessary, after heat treatment, the surface of the substrate is polished for planarity. Standard processes device steps are then performed.

The thick portions of the dual buried oxide film are preferably formed to a thickness of a standard buried oxide film, preferably less than one micron. The thin portion of the dual buried oxide film is anything thinner than the standard buried oxide thickness. Amounts thinner than the thick portion of the buried oxide film will improve the thermal characteristics of the device.

FIGS. 14A–E show an alternative method of forming the dual thickness buried oxide film. In this embodiment, an oxide growth retarding implant is used to create the thin portion of the dual thickness buried oxide film.

Figure 14A:
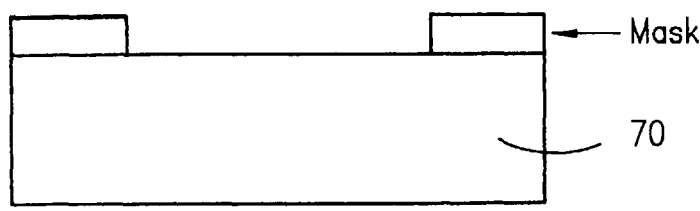
FIGS. 14a–14e illustrate a second method for forming a dual thickness buried oxide structure.
Figure 14B:
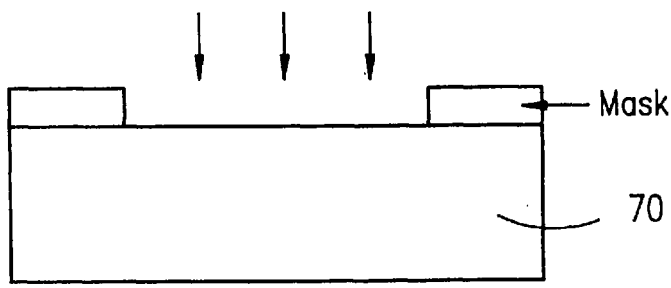
Figure 14C:
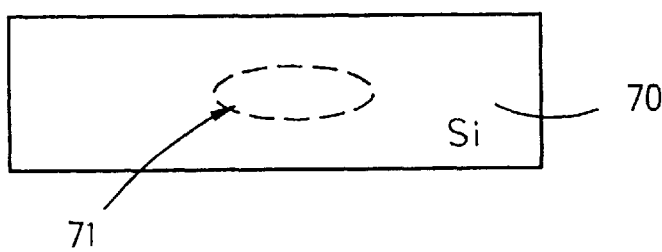
Figure 14D:
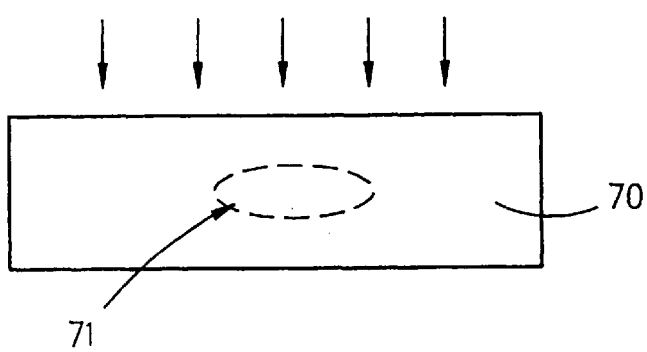
Figure 14E:
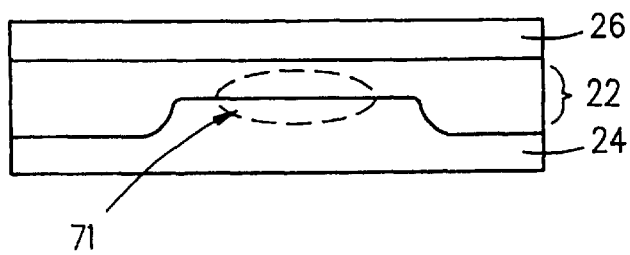

A mask is formed over the substrate 70 and an oxide growth retarding implant, such as nitrogen, is formed in a selected region 71 of the substrate 70 as shown in FIGS. 14A–C. The oxide growth retarding implant is preferably performed at a dose of $10^{17}$ to $10^{19}/cm^2$ and should reach a depth of the subsequent oxygen ion implant. The oxide growth retarding implant is used to prevent oxide from forming in the subsequent steps and, consequently result in the thin portion of the buried oxide film. Next, in FIG. 14D oxygen ions are implanted over the entire surface of the substrate. The implant of oxygen ions preferably reaches at least to the region of the oxide growth retarding implant so that a thin region of oxygen ions is implanted above the oxide growth retarding implant area, while a thicker layer of oxygen implants is formed in other areas of the substrate as shown in FIG. 14E. Heat treatment is then performed on the ion implanted substrate to form the buried oxide. The oxygen ion implantation is done so that a buried oxide with a co-planar top surface is formed. If necessary, the top surface of the substrate is then polished for planarity and standard device formation steps are carried out.

In each of the above described methods, a single substrate is used. The substrate is then divided into two areas by a buried oxide layer. The buried oxide layer isolates the two areas from each other. Preferably, the buried oxide layer is a dual thickness layer with a planar top surface.

A third method of forming the dual thickness buried oxide will now be described with reference to FIGS. 15A–E.

Figure 15A:
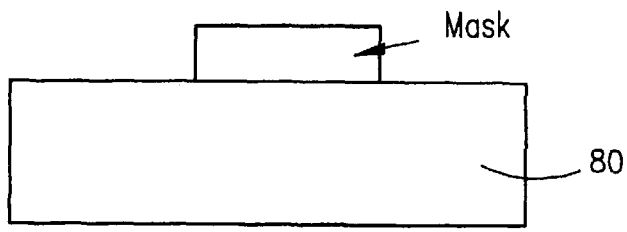
FIGS. 15a–15e illustrate a third method for forming a dual thickness buried oxide structure.
Figure 15B:
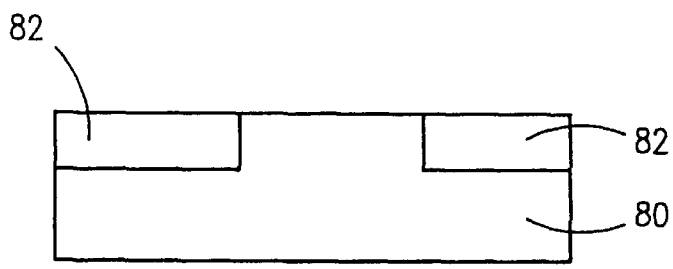
Figure 15C:
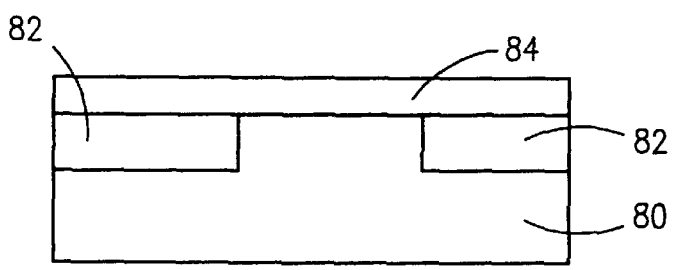
Figure 15D:
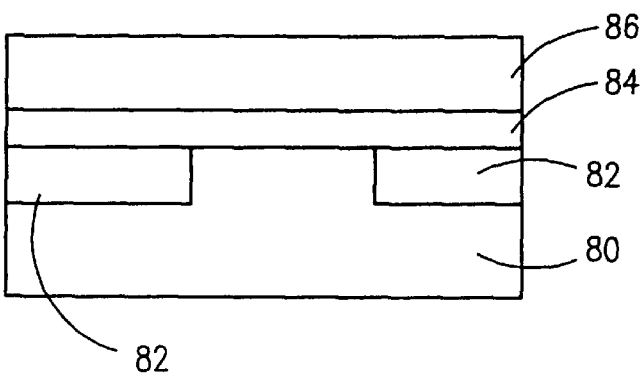
Figure 15E:
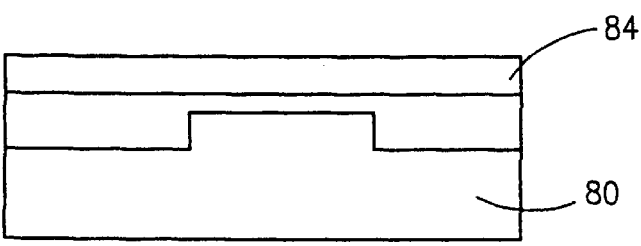

Here, two substrate wafers are used and shallow trench isolation provides the thick portion of the buried oxide. A mask is formed on the first substrate 80 and etching is performed to form isolation trenches 82. The isolation trenches 82 are filled with a dielectric, the mask is removed, and the surface of the first substrate is polished to be substantially planar as shown in FIGS. 15A–B. Next, the layer of oxide 84 shown in FIG. 15C is deposited or grown on top of the first substrate 80 and the shallow trench isolation regions 82. The oxide 84 is formed to have a substantially planar top surface. A second substrate 86 is then attached on the top surface of the buried oxide and heat treatment is performed for bonding to form the buried oxide layer. The second substrate 86 is then snapped or etched to a desired thickness as shown in FIGS. 15D–E and standard process steps are then performed.

Accordingly, an SOI structure with a dual thickness buried oxide and method of forming the same has been provided. This method and apparatus allows the thermal impedance and the capacitive coupling to be modulated in an SOI structure. Thus, the advantages of having a thin oxide or a thick oxide can be provided wherever it is beneficial to do so.

While a preferred embodiment of the invention has been described above, since variations in the invention will be apparent to those skilled in the art, the invention should not be construed as limited to the specific embodiments described above. For example, although the present invention has been described with regard to a buried oxide, any insulator may be used and the positioning of the thick portion and the thin portion of the buried insulator can be varied.

We claim:

1. A semiconductor chip comprising:

a first substrate;

a dielectric with a planar top surface covering said first substrate; and a second substrate formed directly on top of said planar top surface, said dielectric having thick and thin regions formed at predetermined locations between said first and second substrates, wherein said thick region is formed in a core of said chip and said thin region is formed in a periphery of said chip.

2. The semiconductor chip of claim 1 further comprising semiconductor devices formed in said second substrate.

3. A semiconductor chip, comprising:

a first substrate;

a dielectric with a continuous planar top surface covering said first substrate; and a second substrate formed directly on top of said planar top surface, said dielectric having thick and thin regions formed at predetermined locations between said first and second substrates; and a semiconductor device arranged in said second substrate.

4. The semiconductor chip of claim 3 wherein said semiconductor device is a transistor.

5. The semiconductor chip of claim 4 wherein the thickness of said dielectric also varies under said semiconductor device.

6. The semiconductor chip of claim 3 wherein said semiconductor device is a resistor.

7. The semiconductor chip of claim 6 wherein the thickness of said dielectric also varies under said semiconductor device.

8. The semiconductor chip of claim 3 wherein said semiconductor device is a decoupling capacitor.

9. The semiconductor chip of claim 3 wherein said semiconductor device is a polysilicon-bond diode.

10. The apparatus of claim 3 wherein said in regions are formed in a center portion of said chip and said thick region is formed around said center portion.

11. A silicon wafer, comprising:

a first substrate;

a dielectric with a continuous planar top surface covering said first substrate, wherein a thickness of said dielectric varies;

a second substrate on said planar top surface of said dielectric, wherein said dielectric is continuous and isolates said first substrate from said second substrate; and semiconductor chips formed in said second substrate.

12. The apparatus of claim 11 wherein said first substrate has raised portions and said dielectric with said planar top surface covers said raised portions.

13. A silicon wafer, comprising:

a first substrate;

a dielectric with a planar top surface covering said first substrate, wherein a thickness of said dielectric varies;

a second substrate on said planar top surface of said dielectric, wherein said dielectric is continuous and isolates said first substrate from said second substrate; and semiconductor chips formed in said second substrate, wherein the thickness of said dielectric varies in individual ones of said semiconductor chips.

14. A semiconductor device comprising:

a first substrate having raised portions;

a non-continuous first dielectric covering said first substrate, a top surface of said first dielectric being substantially co-planar with a top surface of said raised portions;

a continuous second dielectric having a planar top surface and being formed directly on said top surfaces of said first dielectric and said raised portions; and a second substrate formed directly on top of said planar top surface of said second dielectric.

15. A semiconductor device comprising:

a first substrate;

a buried oxide, having a continuous planar top surface and thick and thin portions, formed on top of said first substrate;

a second substrate on top of said planar top surface;

a drain formed in said second substrate;

a source formed in said second substrate; and a first gate structure formed over said second substrate between said source and said drain.

16. The semiconductor device of claim 15 wherein said channel region is of the same conductivity type as said source and said drain, but is lower doped.

17. The semiconductor device of claim 15 wherein said thin portion of said buried oxide is arranged under said first gate structure and said thick portions are arranged under said source and said drain.

18. The semiconductor device of claim 17 further comprising a second gate structure formed in said thick portion under only one of said source and said drain.

19. The semiconductor device of claim 15 wherein said thin portion is arranged under only one of said source and said drain and said thick portion is arranged under said first gate structure and the other of said source and said drain.

20. The semiconductor device of claim 19 further comprising a second gate structure formed in said thick portion of said buried oxide under said first gate structure.

21. The semiconductor device of claim 19 further comprising a second gate structure formed in said thick portion under the other of said source and said drain.

22. The semiconductor device of claim 15 wherein said thin portion is arranged under at least a part or all of said source, said drain, and said first gate structure.

23. The semiconductor device of claim 15 wherein said source and said drain are connected as an anode and a cathode.

24. The semiconductor device of claim 15 wherein said thin portion extends under the entire first gate structure and under at least a part of both of said source and said drain.

25. The semiconductor device of claim 15 wherein said thick portion extends under the entire gate structure and under at least a part of both of said source and said drain and a second gate structure is arranged in said thick portion which extends under the entire gate structure and under at least a part of both of said source and said drain.

* * * * *